(12) United States Patent
Choi et al.

(10) Patent No.: US 8,367,448 B2
(45) Date of Patent: Feb. 5, 2013

(54) CAPACITOR AND ORGANIC LIGHT EMITTING DISPLAY DEVICE

(75) Inventors: Chaun-Gi Choi, Yongin (KR);
Chang-Mo Park, Yongin (KR);
Jong-Han Jeong, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 284 days.

(21) Appl. No.: 12/926,049

(22) Filed: Oct. 22, 2010

(65) Prior Publication Data

US 2011/0220888 A1    Sep. 15, 2011

(30) Foreign Application Priority Data

Mar. 12, 2010   (KR) .................. 10-2010-0022423

(51) Int. Cl.
*H01L 21/00*   (2006.01)
*H01L 33/00*   (2010.01)

(52) U.S. Cl. .......................... 438/43; 257/103

(58) Field of Classification Search .............. 438/22–47, 438/386–399; 257/79–103, 531–535
See application file for complete search history.

(56) References Cited

U.S. PATENT DOCUMENTS

| | | | |
|---|---|---|---|
| 6,858,479 B2 * | 2/2005 | Kim et al. ................ | 438/158 |
| 7,112,820 B2 | 9/2006 | Chang et al. | |
| 2003/0102478 A1 * | 6/2003 | Joo et al. ................ | 257/72 |
| 2008/0012477 A1 * | 1/2008 | Koo et al. ................ | 313/504 |
| 2008/0055503 A1 * | 3/2008 | Cheng ................ | 349/38 |
| 2008/0197356 A1 * | 8/2008 | Kim et al. ................ | 257/71 |
| 2008/0315189 A1 | 12/2008 | Lee et al. | |
| 2009/0068773 A1 * | 3/2009 | Lai et al. ................ | 438/23 |
| 2009/0108256 A1 | 4/2009 | Kwak et al. | |
| 2009/0160741 A1 | 6/2009 | Inoue et al. | |
| 2010/0176383 A1 | 7/2010 | Park et al. | |

FOREIGN PATENT DOCUMENTS

| | | |
|---|---|---|
| JP | 2007-286150 A | 11/2007 |
| JP | 2009-003405 A | 1/2009 |
| KR | 10 2007-0027795 A | 3/2007 |
| KR | 10 2008-0083898 A | 9/2008 |
| KR | 10 2009-0044119 A | 5/2009 |
| KR | 10-0916921 B1 | 9/2009 |
| KR | 10 2009-0105560 A | 10/2009 |
| KR | 10 2009-0105561 A | 10/2009 |
| KR | 10 2010-0082940 A | 7/2010 |

* cited by examiner

*Primary Examiner* — Fernando L Toledo
*Assistant Examiner* — Karen Kusumakar
(74) *Attorney, Agent, or Firm* — Lee & Morse, P.C.

(57) ABSTRACT

A capacitor of an organic light emitting display device includes a first metal layer on a substrate, a first insulating layer on the first metal layer, an oxide semiconductor layer on the first insulating layer, the oxide semiconductor layer corresponding to the first metal layer, a second insulating layer on the first insulating layer, the second insulating layer including an opening exposing a portion of the oxide semiconductor layer, and a second metal layer on the second insulating layer and in the opening, the second metal layer being connected to the exposed portion of the oxide semiconductor layer.

13 Claims, 5 Drawing Sheets

CAPACITOR AND ORGANIC LIGHT EMITTING DISPLAY DEVICE

BACKGROUND

1. Field

Example embodiments relate to a capacitor and an organic light emitting display device including the same. More particularly, example embodiments relate to a capacitor using an oxide semiconductor, and an organic light emitting display device including the same.

2. Description of the Related Art

In currently spotlighted active matrix-type organic light emitting display devices, every pixel includes a thin film transistor and a capacitor, and an organic light emitting element connected to the thin film transistor and the capacitor. The organic light emitting element receives an appropriate driving signal from the thin film transistor and the capacitor and emits light, thereby displaying a desired image.

A capacitor has to have a sufficient charge capacity to more stably display an image of the organic light emitting display device. That is, a more natural image may be displayed when a charge capacity of the capacitor is sufficient.

SUMMARY

Embodiments are directed to a capacitor and an organic light emitting display device including the same, which substantially overcome one or more of the problems due to the limitations and disadvantages of the related art.

It is therefore a feature of an embodiment to provide a capacitor with an increased charge capacity, an organic light emitting display device including the same, and a method of manufacturing the same.

At least one of the above and other features and advantages may be realized by providing a capacitor of an organic light emitting display device, including a first metal layer on a substrate, a first insulating layer on the first metal layer, an oxide semiconductor layer on the first insulating layer, the oxide semiconductor layer corresponding to the first metal layer, a second insulating layer on the first insulating layer, the second insulating layer including an opening exposing a portion of the oxide semiconductor layer, and a second metal layer on the second insulating layer and in the opening, the second metal layer being connected to the exposed portion of the oxide semiconductor layer.

The second insulating layer may cover edge portions of the oxide semiconductor layer and expose a center portion of the oxide semiconductor layer through the opening.

The opening in the second insulating layer may expose a majority of an upper surface of the oxide semiconductor layer.

A contact surface between the second metal layer and the oxide semiconductor layer may overlap an entire bottom of the opening.

The first metal layer, the first insulating layer, the oxide semiconductor layer, and the second metal layer may be sequentially stacked through the opening of the second insulating layer.

At least one of the above and other features and advantages may also be realized by providing an organic light emitting display device, including an organic light emitting element, a thin film transistor electrically connected to the organic light emitting element, and a capacitor electrically connected to the organic light emitting element, the capacitor including a first metal layer on a substrate, a first insulating layer on the first metal layer, an oxide semiconductor layer on the first insulating layer, the oxide semiconductor layer corresponding to the first metal layer, a second insulating layer on the first insulating layer, the second insulating layer including a first opening exposing a portion of the oxide semiconductor layer, and a second metal layer on the second insulating layer and in the first opening, the second metal layer being connected to the exposed portion of the oxide semiconductor layer.

The second insulating layer may cover edge portions of the oxide semiconductor layer and expose a center portion of the oxide semiconductor layer through the first opening.

The first metal layer, the first insulating layer, the oxide semiconductor layer, and the second metal layer may be sequentially stacked through the first opening of the second insulating layer.

The thin film transistor may include a gate electrode on the substrate, the gate electrode being on a same level as the first metal layer, an active layer on a same level as the oxide semiconductor layer, the active layer and oxide semiconductor layer including a same material and being positioned on the first insulating layer, and source-drain electrodes on a same level as the second metal layer, the source-drain electrodes being positioned on the second insulating layer and electrically connected to the active layer through a second opening in the second insulating layer.

The organic light emitting display device may further include a passivation layer between the organic light emitting element and each of the thin film transistor and the capacitor, the organic light emitting element being electrically connected to the thin film transistor and the capacitor through the passivation layer.

At least one of the above and other features and advantages may also be realized by providing a method of forming an organic light emitting display device, the method including forming an organic light emitting element on a substrate, forming a thin film transistor electrically connected to the organic light emitting element, and forming a capacitor electrically connected to the organic light emitting element, the capacitor including a first metal layer on the substrate, a first insulating layer on the first metal layer, an oxide semiconductor layer on the first insulating layer, the oxide semiconductor layer corresponding to the first metal layer, a second insulating layer on the first insulating layer, the second insulating layer including an opening exposing a portion of the oxide semiconductor layer, and a second metal layer on the second insulating layer and in the opening, the second metal layer being connected to the exposed portion of the oxide semiconductor layer.

Forming the thin film transistor may include forming a gate electrode and an active layer, the gate electrode being formed simultaneously and on a same level as the first metal layer, and the active layer being formed simultaneously and on a same level as the oxide semiconductor layer.

The method may further include using plasma to process the exposed portion of the oxide semiconductor layer through the opening of the second insulating layer, such that resistance of the oxide semiconductor layer is reduced.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
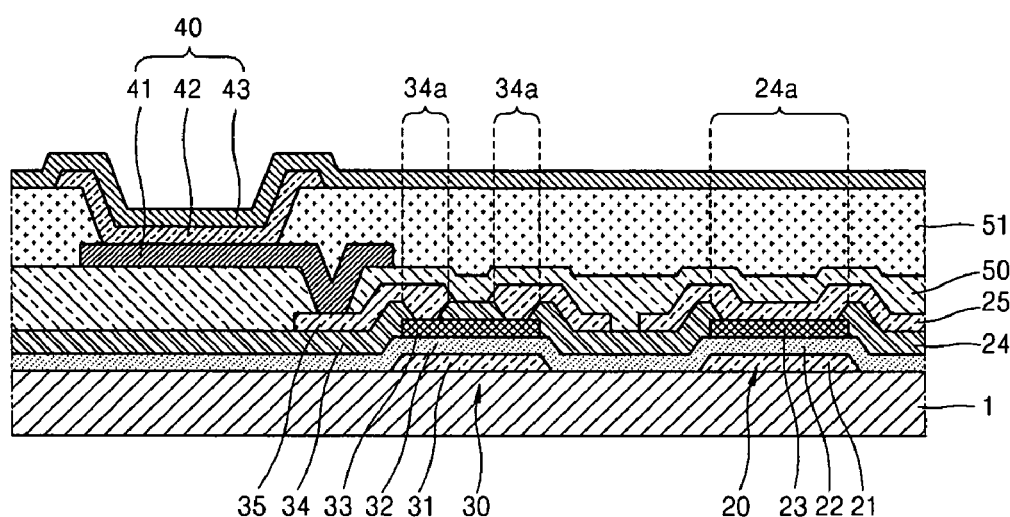
FIG. 1 illustrates a cross-sectional view of an organic light emitting display device including a capacitor, according to an embodiment.

Korean Patent Application No. 10-2010-0022423, filed on Mar. 12, 2010, in the Korean Intellectual Property Office, and entitled: "Capacitor and Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light emitting display device including a capacitor according to an embodiment. As illustrated in FIG. 1, an organic light emitting display device according to an embodiment may include a thin film transistor 30, a capacitor 20, and an organic light emitting element 40 on a substrate 1. For brevity, only one pixel of a plurality of pixels of the organic light emitting display device is illustrated in FIG. 1.

Referring to FIG. 1, the organic light emitting element 40 is electrically connected to the thin film transistor 30 and the capacitor 20 so as to emit light, and may include a pixel electrode 41 formed in every pixel, a counter electrode 43 that is a common electrode, and an organic emission layer 42 between the pixel electrode 41 and the counter electrode 43. Accordingly, if a voltage is applied from the thin film transistor 30 and the capacitor 20 to the pixel electrode 41, i.e., when a predetermined voltage is applied between the pixel electrode 41 and the counter electrode 43, the organic emission layer 42 emits light.

In a top emission structure for displaying an image in a direction toward the counter electrode 43, the pixel electrode 41 may be a reflective electrode. For this, the pixel electrode 41 may include a reflective layer formed of, e.g., an alloy of aluminum (Al), silver (Ag), or the like.

If the pixel electrode 41 is used as an anode, the pixel electrode 41 may include a layer formed of metal oxide having a high work function (absolute value), e.g., indium tin oxide (ITO), indium zinc oxide (IZO) or zinc oxide (ZnO). If the pixel electrode 41 is used as a cathode, the pixel electrode 41 may be formed of highly conductive metal having a low work function (absolute value), e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Accordingly, in this case, the above-described reflective layer is not required.

The counter electrode 43 may be a light-transmissive electrode. For this, the counter electrode 43 may include a transflective layer formed of a thin film of Ag, Mg, Al, Pt, Pd, Au, Ni, Nd, Ir, Cr, Li, Ca, or the like, or may be formed of light-transmissive metal oxide, e.g., ITO, IZO or ZnO. If the pixel electrode 41 is used as an anode, the counter electrode 43 is used as a cathode, and if the pixel electrode 41 is used as a cathode, the counter electrode 43 is used as an anode.

The organic emission layer 42 between the pixel electrode 41 and the counter electrode 43 may be formed by stacking all or some of a hole injection/transport layer, an emission layer, an electron injection/transport layer and the like. However, the organic emission layer 42 essentially includes the emission layer.

Although not shown in FIG. 1, a protective layer may be further formed on the counter electrode 43. Further, the organic light emitting display device may be sealed by using glass, or the like.

As further illustrated in FIG. 1, the thin film transistor 30 may include a gate electrode 31 formed on the substrate 1, a first insulating layer 32 for covering the gate electrode 31, an active layer 33 formed on the first insulating layer 32, a second insulating layer 34 formed on the first insulating layer 32 to cover the active layer 33, and source-drain electrodes 35 connected to the active layer 33 via openings 34a formed in the second insulating layer 34. A buffer layer (not shown) may be further formed on the substrate 1 by using an inorganic material, e.g., silicon oxide.

The gate electrode 31 formed on the substrate 1 may be formed in a single layer or multiple layers by using conductive metal. The gate electrode 31 may be formed of, e.g., molybdenum (Mo).

The first insulating layer 32 may be formed of, e.g., silicon (Si) oxide, tantalum (Ta) oxide, aluminum (Al) oxide, or the like, but is not limited thereto.

The active layer 33 may be patterned on the first insulating layer 32. The active layer 33 may be formed of an oxide semiconductor, e.g., G-I-Z-O [a(In$_2$O$_3$)b(Ga$_2$O$_3$)c(ZnO)] (where a, b and c are real numbers satisfying a≧0, b≧0, and c≧0) or Hf—In—Zn—O.

The second insulating layer 34 may be formed to cover the active layer 33. The second insulating layer 34 may protect a channel of the active layer 33. As illustrated in FIG. 1, the second insulating layer 34 may cover the whole active layer 33 except regions contacting the source-drain electrodes 35, but is not limited thereto. Although not shown in FIG. 1, the second insulating layer 34 may be formed only on the channel. The second insulating layer 34 may also be formed of, e.g., Si oxide, Ta oxide, Al oxide, or the like, but is not limited thereto. The source-drain electrodes 35 may be formed on the second insulating layer 34 so as to contact the active layer 33.

A passivation layer 50 may be formed on the second insulating layer 34 to cover the source-drain electrodes 35. The pixel electrode 41 of the organic light emitting element 40, which contacts the source-drain electrodes 35, may be formed on the passivation layer 50.

A pixel defining layer 51 for exposing a portion of the pixel electrode 41 may be formed on the passivation layer 50. The organic emission layer 42 and the counter electrode 43 may be sequentially formed on the pixel electrode 41 exposed by the pixel defining layer 51.

The structure of the capacitor 20 will now be described. As further illustrated in FIG. 1, the capacitor 20 may include a first metal layer 21, a first insulating layer 22, an oxide semiconductor layer 23, a second insulating layer 24, and a second metal layer 25.

The first metal layer 21 may be formed on, e.g., directly on, the substrate 1. The first metal layer 21 may be formed simultaneously with the gate electrode 31 of the thin film transistor 30 at the same level, e.g., the first metal layer 21 and the gate electrode 31 may be formed directly on the substrate 1 of molybdenum (Mo).

The first insulating layer 22 of the capacitor 20 and the first insulating layer 32 of the thin film transistor 30 may be formed as one layer over regions of the capacitor 20 and the thin film transistor 30. For example, a single insulating layer may be formed on, e.g., directly on, the capacitor 20 and the thin film transistor 30, so a portion of the single insulating layer above the capacitor 20 may define the first insulating layer 22 of the capacitor 20, and a portion of the single insulating layer above the thin film transistor 30 may define the first insulating layer 32 of the thin film transistor 30. Also, the second insulating layer 24 of the capacitor 20 and the second insulating layer 34 of the thin film transistor 30 may be formed as one layer over the regions of the capacitor 20 and the thin film transistor 30.

The oxide semiconductor layer 23 of the capacitor 20 may be formed on, e.g., directly on, the first insulating layer 22 of the capacitor 20. The oxide semiconductor layer 23 may be formed simultaneously with the active layer 33 of the thin film transistor 30 at the same level, and may be formed of, e.g., G-I-Z-O [a($In_2O_3$)b($Ga_2O_3$)c(ZnO)] (where a, b, and c are real numbers satisfying a≧0, b≧0, and c≧0) or Hf—In—Zn—O for forming the active layer 33.

The second metal layer 25 of the capacitor 20 may be formed simultaneously with the source-drain electrodes 35 of the thin film transistor 30 at the same level. The second metal layer 25 may be formed of conductive metal, e.g., of a substantially same material as the source-drain electrodes 35.

A method of manufacturing the organic light emitting display device including the capacitor 20 will now be described with reference to FIGS. 2A-2J. FIGS. 2A through 2J illustrate cross-sectional views of stages in a method of manufacturing the organic light emitting display device illustrated in FIG. 1.

Figure 2A:
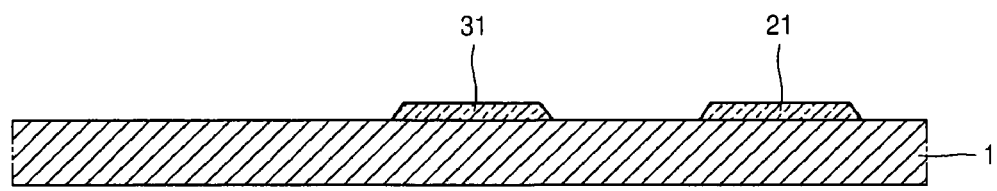
FIGS. 2A through 2J illustrate cross-sectional views of stages in a method of manufacturing an organic light emitting display device with a capacitor according to an embodiment.

Initially, as illustrated in FIG. 2A, the first metal layer 21 of the capacitor 20 and the gate electrode 31 of the thin film transistor 30 may be formed on the substrate 1. Although not shown in FIG. 2A, the buffer layer may be initially formed on the substrate 1, and then the first metal layer 21 and the gate electrode 31 may be formed on the buffer layer.

Figure 2B:
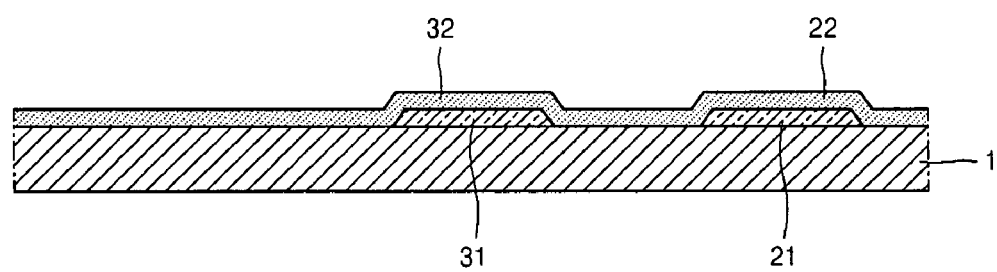

Then, as illustrated in FIG. 2B, an insulating layer, i.e., the first insulating layers 22 and 32, may be formed to respectively cover the first metal layer 21 and the gate electrode 31. For example, the first insulating layers 22 and 32 may be connected to define a single continuous layer over the substrate 1.

Figure 2C:
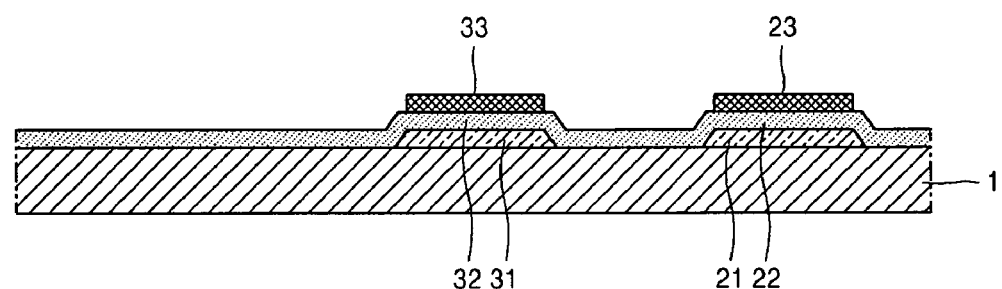

After that, as illustrated in FIG. 2C, the oxide semiconductor layer 23 corresponding to, e.g., overlapping, the first metal layer 21 and the active layer 33 corresponding to, e.g., overlapping, the gate electrode 31 may be formed simultaneously on the first insulating layers 22 and 32. As illustrated in FIG. 2C, the oxide semiconductor layer 23 may be formed to overlap the first metal layer 21, e.g., a bottom of the oxide semiconductor layer 23 may completely overlap a horizontal upper surface of the first metal layer 21.

Figure 2D:
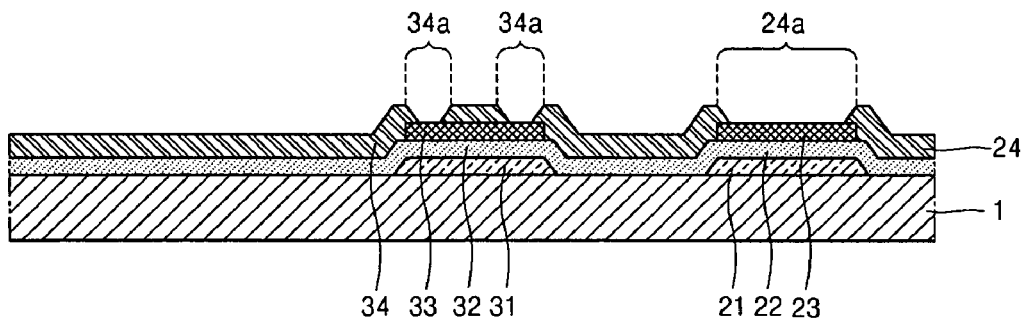

Then, as illustrated in FIG. 2D, a second insulating layer, i.e., the second insulating layers 24 and 34, may be respectively formed on the first insulating layers 22 and 32 to cover the oxide semiconductor layer 23 and the active layer 33, respectively. Openings 24a and 34a may be formed in the second insulating layer to expose upper surfaces of the oxide semiconductor layer 23 and the active layer 33, respectively. That is, a portion of the second insulating layer 24 may be removed to form the opening 24a exposing the upper surface of the oxide semiconductor layer 23, and a portion of the second insulating layer 34 may be removed to form the openings 34a exposing the upper surface of the active layer 33. The openings 24a and 34a may be patterned by using, e.g., a dry etching method.

For example, the upper surface of the oxide semiconductor layer 23, which is exposed by the opening 24a, may be plasma-processed by using an argon (Ar) gas or a hydrogen (H) gas. As such, the contact resistance between the oxide semiconductor layer 23 and the second metal layer 25 to be stacked later may be reduced, thereby improving electrical conductivity.

Figure 2E:
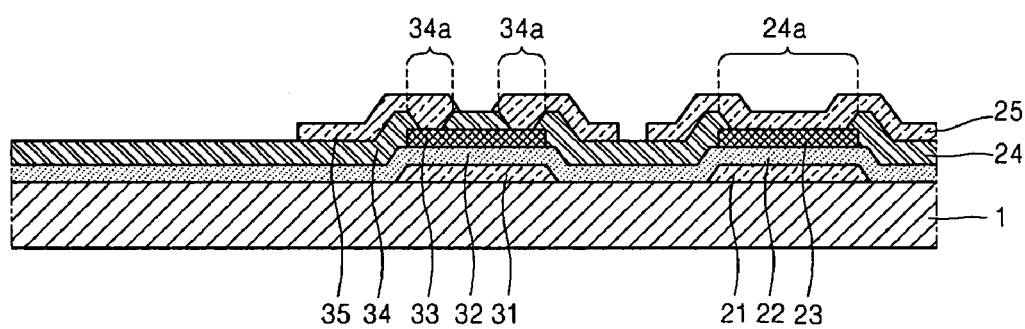

Then, as illustrated in FIG. 2E, the second metal layer 25 and the source-drain electrodes 35 may be formed to be respectively connected to the oxide semiconductor layer 23 and the active layer 33 through the openings 24a and 34a. That is, the second metal layer 25 may be formed on the second insulating layer 24 and in the opening 24a to contact the oxide semiconductor layer 23, e.g., the second metal layer 25 may completely fill the opening 24a so a bottom surface of the second metal layer 25 inside the opening 24a and the exposed upper surface of the oxide semiconductor 23 may have a surface contact. Similarly, the source-drain electrodes 35 may be formed on the second insulating layer 34 to contact the gate electrode 33.

As such, a basic structure of the capacitor 20, in which the first metal layer 21, the first insulating layer 22, the oxide semiconductor layer 23, and the second metal layer 25 are sequentially stacked through the opening 24a, may be completed. That is, a metal layer-insulating layer-semiconductor layer-metal layer stacked structure may be formed, thereby increasing charge capacity of the capacitor 20. In contrast, a conventional capacitor may include a metal layer-insulating layer-insulating layer-metal layer stacked structure, i.e., a structure without a semiconductor layer, thereby having a relatively thick dielectric and low charge capacity. However, since the capacitor 20 according to example embodiments includes the semiconductor layer 23, which replaces one of the insulating layers in the opening, a relative thickness of an insulating layer is reduced. Therefore, a charge capacity may be increased. Also, since the oxide semiconductor layer 23 is formed simultaneously with the active layer 33 of the thin film transistor 30 at the same level, the manufacturing processing may be simplified, i.e., an additional process may be eliminated, and manufacturing costs may be reduced.

It is noted, as illustrated in FIGS. 2D-2J, that the second insulating layer 24 may cover edge portions of the oxide semiconductor layer 23, e.g., may cover only edge portions of the oxide semiconductor layer 23 to expose a center portion of the oxide semiconductor layer 23. For example, the opening 24a in the second insulating layer 24 may expose a majority of the upper surface of the oxide semiconductor layer 23, e.g., a width of the second insulating layer 24 on the upper surface of the oxide semiconductor layer 23 along a horizontal direction may be smaller than a thickness of the oxide semiconductor layer 23 along a vertical direction. As such, the oxide semiconductor layer 23 may be positioned between, e.g., directly between, the first insulating layer 22 and the second metal layer 25, with the second insulating layer 24 contacting edge portions thereof. It is further noted that the structure of the second insulating layer 24 on the edge portions of the oxide semiconductor layer 23 prevents or substantially minimizes charge leakage along fine cracks between the second insulating layer 24 and the edge portions of the oxide semiconductor layer 23, thereby improving function of the capacitor 20.

Figure 2F:
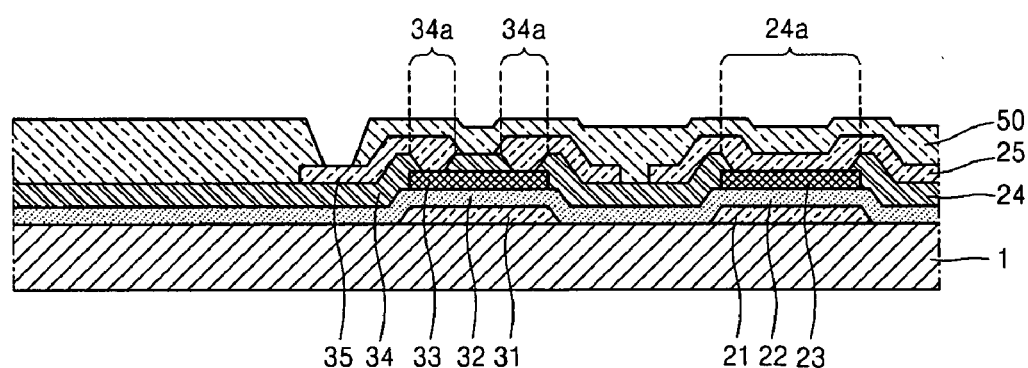
Figure 2G:
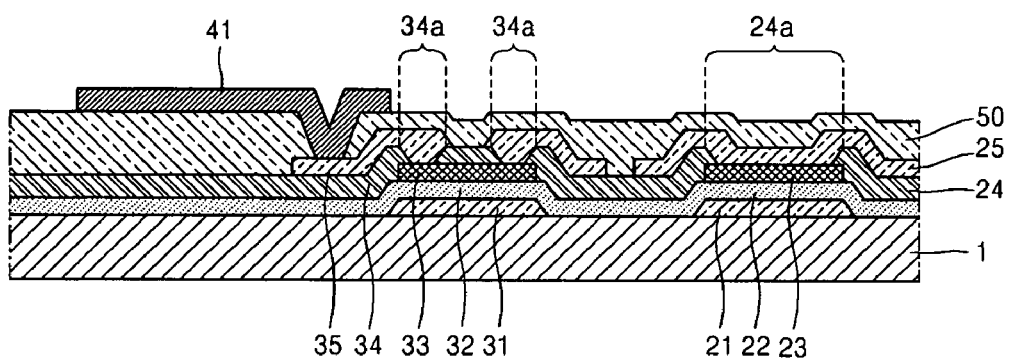
Figure 2H:
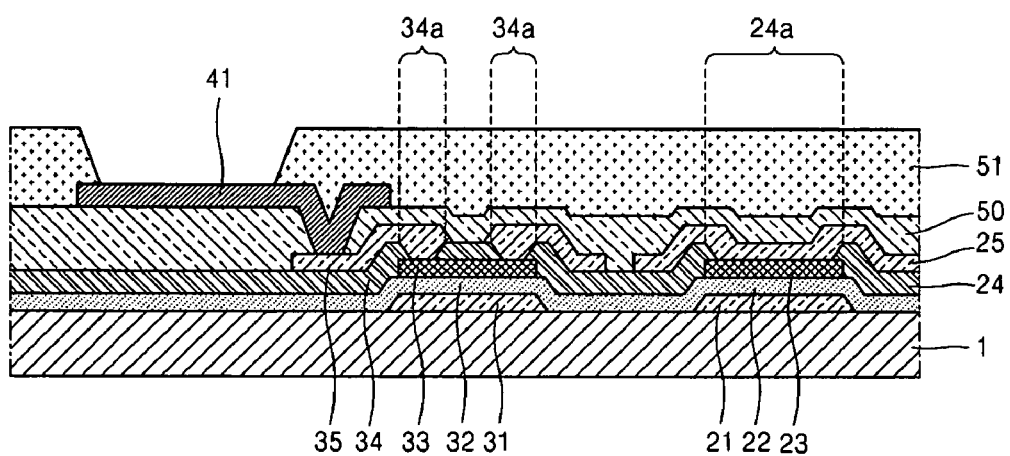

Next, as illustrated in FIG. 2F, the passivation layer 50 may be formed on the second metal layer 25 and the source-drain electrodes 35. The pixel electrode 41 may be connected to the source-drain electrodes 35 through a hole in the passivation layer 50, as illustrated in FIG. 2G. Further, the pixel defining layer 51 for defining a pixel may be formed on a portion of the pixel electrode 41, as illustrated in FIG. 2H.

Figure 2I:
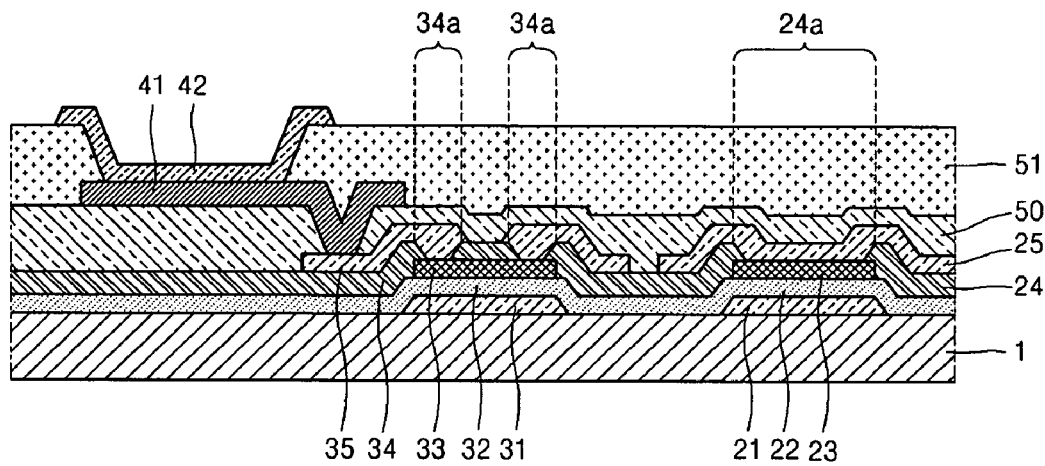
Figure 2J:
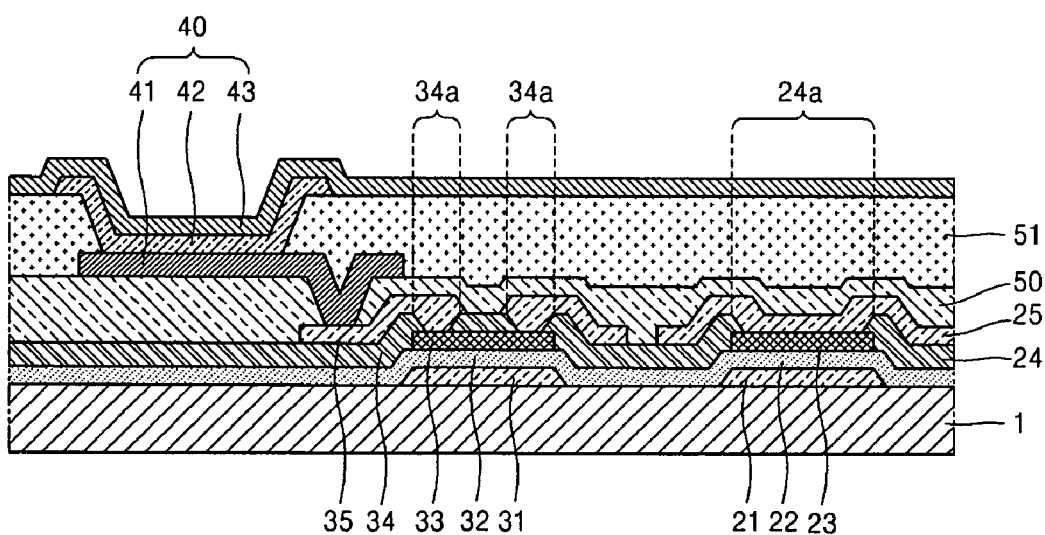

Then, as illustrated in FIG. 2I, the organic emission layer 42 may be formed on the pixel electrode 41. The counter electrode 43 may be formed on the organic emission layer 42, as illustrated in FIG. 2J, thereby completing formation of the organic light emitting display device. After that, the protective layer may be formed, and the glass for sealing may be applied to the counter electrode 43.

As described above, the capacitor 20 according to example embodiments may have a metal layer-insulating layer-semiconductor layer-metal layer stacked structure through an opening of an insulating layer. Therefore, a charge capacity of the capacitor 20 may be increased without particularly increasing an area of the capacitor 20. That is, the charge capacity may be increased without reducing a light emitting region of the organic light emitting element. Thus, an organic light emitting display device using the capacitor 20 may display an image more stably and more naturally. In contrast, when a size of a conventional capacitor is increased to increase a charge capacity, a light emitting region of an organic light emitting element may be reduced, thereby lowering luminance.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A capacitor of an organic light emitting display device, the capacitor comprising:
   a first metal layer on a substrate;
   a first insulating layer on the first metal layer;
   an oxide semiconductor layer on the first insulating layer, the oxide semiconductor layer corresponding to the first metal layer;
   a second insulating layer on the first insulating layer, the second insulating layer including an opening exposing a portion of the oxide semiconductor layer; and
   a second metal layer on the second insulating layer and in the opening, the second metal layer being connected to the exposed portion of the oxide semiconductor layer.

2. The capacitor as claimed in claim 1, wherein the second insulating layer covers edge portions of the oxide semiconductor layer and exposes a center portion of the oxide semiconductor layer through the opening.

3. The capacitor as claimed in claim 1, wherein the opening in the second insulating layer exposes a majority of an upper surface of the oxide semiconductor layer.

4. The capacitor as claimed in claim 3, wherein a contact surface between the second metal layer and the oxide semiconductor layer overlaps an entire bottom of the opening.

5. The capacitor as claimed in claim 1, wherein the first metal layer, the first insulating layer, the oxide semiconductor layer, and the second metal layer are sequentially stacked through the opening of the second insulating layer.

6. An organic light emitting display device, comprising:
   an organic light emitting element;
   a thin film transistor electrically connected to the organic light emitting element; and
   a capacitor electrically connected to the organic light emitting element, the capacitor including:
      a first metal layer on a substrate,
      a first insulating layer on the first metal layer,
      an oxide semiconductor layer on the first insulating layer, the oxide semiconductor layer corresponding to the first metal layer,
      a second insulating layer on the first insulating layer, the second insulating layer including a first opening exposing a portion of the oxide semiconductor layer, and
      a second metal layer on the second insulating layer and in the first opening, the second metal layer being connected to the exposed portion of the oxide semiconductor layer.

7. The organic light emitting display device as claimed in claim 6, wherein the second insulating layer covers edge portions of the oxide semiconductor layer and exposes a center portion of the oxide semiconductor layer through the first opening.

8. The organic light emitting display device as claimed in claim 6, wherein the first metal layer, the first insulating layer, the oxide semiconductor layer, and the second metal layer are sequentially stacked through the first opening of the second insulating layer.

9. The organic light emitting display device as claimed in claim 6, wherein the thin film transistor includes:
   a gate electrode on the substrate, the gate electrode being on a same level as the first metal layer;
   an active layer on a same level as the oxide semiconductor layer, the active layer and oxide semiconductor layer including a same material and being positioned on the first insulating layer; and
   source-drain electrodes on a same level as the second metal layer, the source-drain electrodes being positioned on the second insulating layer and electrically connected to the active layer through a second opening in the second insulating layer.

10. The organic light emitting display device as claimed in claim 6, further comprising a passivation layer between the organic light emitting element and each of the thin film transistor and the capacitor, the organic light emitting element being electrically connected to the thin film transistor and the capacitor through the passivation layer.

11. A method of forming an organic light emitting display device, comprising:
   forming an organic light emitting element on a substrate;
   forming a thin film transistor electrically connected to the organic light emitting element; and
   forming a capacitor electrically connected to the organic light emitting element, the capacitor including:
      a first metal layer on the substrate,
      a first insulating layer on the first metal layer,
      an oxide semiconductor layer on the first insulating layer, the oxide semiconductor layer corresponding to the first metal layer, a second insulating layer on the first insulating layer, the second insulating layer including an opening exposing a portion of the oxide semiconductor layer, and a second metal layer on the second insulating layer and in the opening, the second metal layer being connected to the exposed portion of the oxide semiconductor layer.

12. The method as claimed in claim 11, wherein forming the thin film transistor includes forming a gate electrode and an active layer, the gate electrode being formed simultaneously and on a same level as the first metal layer, and the active layer being formed simultaneously and on a same level as the oxide semiconductor layer.

13. The method as claimed in claim 11, further comprising using plasma to process the exposed portion of the oxide semiconductor layer through the opening of the second insulating layer, such that resistance of the oxide semiconductor layer is reduced.

* * * * *